United States Patent [19]

Fichtner

[11] 4,023,074
[45] May 10, 1977

[54] LOUDSPEAKER PROTECTION NETWORK

[75] Inventor: Roland H. Fichtner, Waterloo, Canada

[73] Assignee: Electrohome Limited, Kitchener, Canada

[22] Filed: Nov. 21, 1975

[21] Appl. No.: 634,243

[52] U.S. Cl. .................. 361/88; 330/207 P; 361/104
[51] Int. Cl.² ................................. H02H 7/20
[58] Field of Search ............. 317/33 R, 31, 33 VR, 317/27 R, 20; 330/207 P

[56] References Cited

UNITED STATES PATENTS

| | | | |
|---|---|---|---|
| 3,376,388 | 4/1968 | Reiffin | 330/207 P X |
| 3,462,697 | 8/1969 | Gilbert | 330/207 P X |
| 3,522,480 | 8/1970 | Routh et al. | 317/20 |
| 3,536,958 | 10/1970 | Sondermeyer | 317/33 R |
| 3,544,720 | 12/1970 | Corderman | 330/207 P X |
| 3,659,218 | 4/1972 | Haneda | 330/207 P |
| 3,731,151 | 5/1973 | Ozawa | 317/27 R |
| 3,731,153 | 5/1973 | Nishimoto | 330/207 P X |
| 3,818,366 | 6/1974 | Arimura et al. | 330/207 P |

Primary Examiner—J D Miller
Assistant Examiner—Patrick R. Salce
Attorney, Agent, or Firm—Sim & McBurney

[57] ABSTRACT

A conventional complementary symmetry push-pull type of current amplifier is modified by the inclusion of a diode which permits the predriver transistor, which otherwise would be turned off, to be turned on, when one of the fuses between the power supply and the amplifier blows, thereby maintaining the D.C. input to and hence the D.C. output of the amplifier at essentially zero volts and keep D.C. off the direct coupled loudspeaker.

4 Claims, 1 Drawing Figure

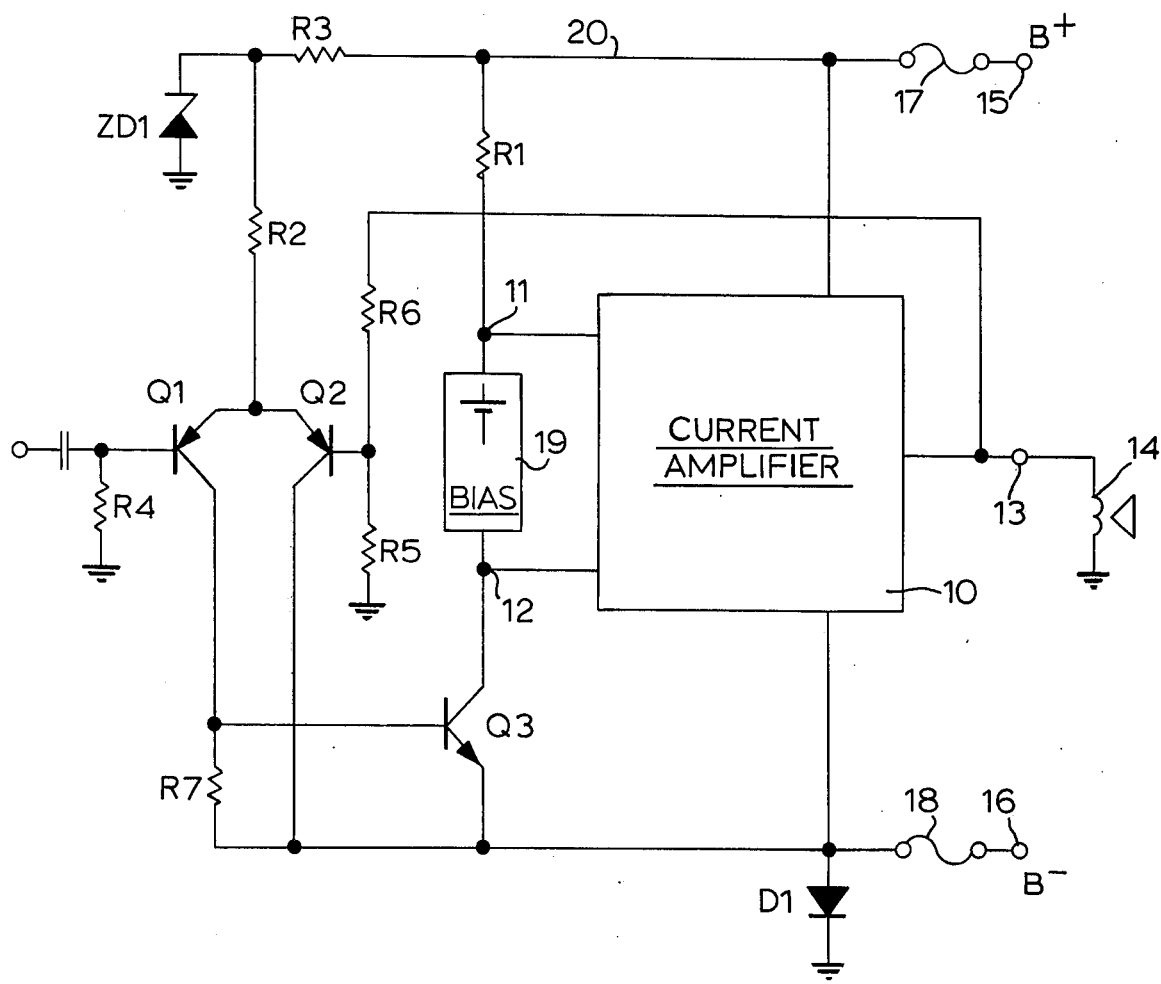

LOUDSPEAKER PROTECTION NETWORK

BACKGROUND OF THE INVENTION

This invention relates to a system and network for protecting a loudspeaker connected in circuit with an audio power amplifier.

In an audio amplification system, it is necessary, in order to protect the loudspeaker, to avoid having any substantial amount of D.C. applied to the loudspeaker. In some systems this objective has been achieved by supplying the output signal of the audio power amplifier to the loudspeaker via a capacitor having a relatively large capacitance. However, the use of such a capacitor substantially attenuates low frequency signals resulting in poor low frequency response.

In order to avoid this disadvantage of the foregoing system, it is known to employ a current amplifier powered from both positive and negative D.C. sources. In such a system the output terminal of the amplifier can be effectively at ground potential, as far as D.C. is concerned, and the other side of the loudspeaker can be grounded, so there will be no D.C. voltage across the loudspeaker. This achieves the desired objective of eliminating D.C. bias on the loudspeaker and, at the same time, does not affect the frequency response of the system.

However, in the case of the last-mentioned system, if there should be a failure of one of the fuses connected between the power supplies and the amplifier, it is possible for a D.C. voltage sufficiently large to damage the loudspeaker to be applied across the loudspeaker.

SUMMARY OF THE INVENTION

In accordance with this invention, there is provided a loudspeaker protection system which avoids the disadvantage of the last-mentioned system and which also does not affect low frequency response. More specifically, in accordance with this invention, there is provided a current amplifier having first and second input terminals and an output terminal, means for direct coupling said output terminal to a loudspeaker, a source of positive D.C. potential, a source of negative D.C. potential, means connecting said source of positive D.C. potential via a first fuse to said current amplifier and connecting said source of negative D.C. potential via a second fuse to said current amplifier to power said current amplifier, biasing means connected between said input terminals, a predriver transistor having base, collector and emitter electrodes, a first resistor, said first resistor being connected between one of said input terminals and one of said sources D.C. potential via one of said fuses, said collector and emitter electrodes being connected between the other of said input terminals and the other of said sources of D.C. potential via the other of said fuses, second and third transistors connected in differential amplifier configuration and each having base, collector and emitter electrodes, means connecting said emitter electrodes of said second and third transistors to one of said sources of D.C. potential via one of said fuses to bias on said second and third transistors, means connecting said collector electrode of said second transistor and said base electrode of said predriver transistor whereby said predriver transistor is biased on from said sources of D.C. potential when said fuses are intact, means for applying an input signal to said base electrode of said second transistor, a negative D.C. feedback network connected between said output terminal and said base electrode of said third transistor and a diode connected in circuit with said emitter electrode of said predriver transistor, said diode being poled and connected to permit said predriver transistor to be biased on when said other fuse blows.

BRIEF DESCRIPTION OF THE DRAWINGS

This invention will be more apparent from the following detailed description, taken in conjunction with the appended drawing which is a circuit diagram of an embodiment of the invention.

DETAILED DESCRIPTION OF THE INVENTION INCLUDING THE PREFERRED EMBODIMENT

Referring to the drawing, there is shown a current amplifier 10 having two input terminals 11 and 12 and an output terminal 13. Current amplifier 10 may be of the complementary symmetry push-pull type, and reference may be made to U.S. Pat. No. 3,536,958 issued Oct. 27, 1970, J. C. Sondermeyer for further details thereof.

Output terminal 13 is direct coupled to the input terminal of a loudspeaker 14 the other terminal of which is connected to D.C. ground.

Terminals 15 and 16 are connected to sources of positive and negative D.C. potential respectively. These may be separate sources, or there may be only a single source capable of providing both positive and negative (relative to ground) D.C. potentials. The source or sources is or are represented by $B^+$ and $B^-$. Normally $B^+$ and $B^-$ will be of the same absolute value, but they may be different as long as the circuitry of the current amplifier is adjusted so that the D.C. level at output terminal 13 is substantially ground potential.

Terminals 15 and 16 are connected to current amplifier 10 so that the current amplifier can be powered from $B^+$ and $B^-$, these connections being via fuses 17 and 18.

Connected between input terminals 11 and 12 is any suitable source 19 of passive D.C. bias. Connected between fuse 17 and input terminal 11 is a resistor R1 while the collector and emitter electrodes of a predriver transistor Q3 are connected in circuit between input terminal 12 and fuse 18.

Transistors Q1 and Q2 are connected in differential amplifier configuration and set exact quiescent D.C. zero at output terminal 13. The emitter electrodes of transistors Q1 and Q2 are connected via resistors R2 and R3 and fuse 17 to $B^+$, and with the bases of these transistors being connected via resistors R4 and R5 to ground, transistors Q1 and Q2 are biased on from $B^+$. Actually the common terminal of resistors R2 and R3 is connected to a Zener diode ZD1, and the Zener voltage across ZD1 establishes the D.C. potential that is applied to transistors Q1 and Q2. The input signal to be amplified and reproduced is applied to the base of transistor Q1 via a coupling capacitor. A negative D.C. feedback network consisting of a resistor R6 is connected between output terminal 13 and the base electrode of transistor Q2, resistor R6 being in voltage divider relationship with resistor R5.

A resistor R7 is connected between the base and emitter electrodes of predriver transistor Q3 and also is connected in circuit between the collector electrode of transistor Q1 and $B^-$ via fuse 18. Resistor R7 determines the magnitudes of the collector currents of transistors Q1 and Q2.

In accordance with this invention, a diode D1 is connected in circuit with biasing resistor R7. It is connected so as to provide a path for collector current of transistor Q1 to flow into the base of transistor Q3 and through resistor R7 and diode D1 when fuse 18 has blown.

The network shown in the Figure is entirely conventional except for the provision of diode D1, and its operation is well-known and understood. The input signal to the base of transistor Q1 is amplified and reproduced by loudspeaker 14. The D.C. output at terminal 13 is maintained at zero (ground potential) by the negative feedback network. In this respect, the D.C. input to the base of transistor Q1 also is a ground potential. This is compared in the differential amplifier with the D.C. voltage fed back to the base of transistor Q2. If there is any difference between these two potentials an error signal is developed across resistor R7. The error signal is amplified by transistor Q3 and the applied to current amplifier 10 to maintain its D.C. output voltage at zero.

In order to understand how diode D1 protects loudspeaker 14, consider what would happen if diode D1 were not present and fuse 18 blew. Under these circumstances transistors Q1 and Q2 will be biased on from B$^+$, but there will be no bias for transistor Q3, so it will be turned off. As a result the D.C. voltage at input terminals 11 and 12 will be essentially B$^+$. It is characteristic of a current amplifier that its output voltage will be approximately the same as its input voltage, so, under these circumstances the D.C. voltage at output terminal 13 will be B$^+$, and this voltage will appear across the loudspeaker, probably destroying it for B$^+$ of normal levels (about 30 volts).

By way of contrast, in normal operation (both fuses intact), transistors Q1, Q2 and Q3 will be biased on. B$^+$ will be dropped across resistor R1 and B$^-$ will be dropped across transistor Q3. The feedback network controls the conductivity of transistor Q3 to assure that B$^-$ is dropped across transistor Q3. Of course the normal condition will not be established instantly when the network is powered, so it is common practice to place a relay in the loudspeaker circuit. The contacts of the relay are held off from closing until the circuit has stabilized.

Consider now the operation of the network with diode D1 present and with fuse 18 blown. Transistors Q1 and Q2 will be biased on from B$^+$, as before, but collector current of transistor Q1 now can flow into the base of transistor Q3 and transistor Q3 is biased on by virtue of the connection to ground via diode D1. B$^+$ will be dropped across resistor R1 and the D.C. voltage at input terminal 12 will be essentially ground, more specifically the drop across diode D1 and the collector-emitter drop of transistor Q3. Hence the D.C. output voltage of current amplifier 10 will be essentially zero and the loudspeaker is protected.

No diode corresponding to diode D1 need be connected between fuse 17 and ground because if fuse 17 blew, transistors Q1, Q2 and Q3 would be turned off for lack of base-emitter bias. Consequently, there would be no current flow through resistor R1, essentially zero D.C. voltage at the input terminals of the current amplifier and hence essentially zero D.C. voltage at its output terminal. However, if Zener diode ZD1 were not present and fuse 17 blew, the bus 20 could become negative from B$^+$ because of the internal circuitry of the current amplifier. With the Zener diode present, if this ever did happen the limit of negative voltage would be determined by the forward drop of a Zener, about 0.7 volts. This voltage would be applied to the input of current amplifier 10 and would appear at output terminal 13, but it is sufficiently small that it would not damage the loudspeaker.

It should be noted, of course, that if transistor Q3 were of the opposite conductivity type to that shown, the positions of transistor Q3 and resistor R1 would be reversed and diode D1 would be connected between bus 20 and ground. Of course, in this case transistors Q1 and Q2 also would be of opposite polarity and Zener diode ZD1 would be powered through a resistor R3 connected to B$^-$.

What is claimed is:

1. A current amplifier having first and second input terminals and an output terminal, means for direct coupling said output terminal to a loudspeaker, a source of positive D.C. potential, a source of negative D.C. potential, means connecting said source of positive D.C. potential via a first fuse to said current amplifier and connecting said source of negative D.C. potential via a second fuse to said current amplifier to power said current amplifier, biasing means connected between said input terminals, a predriver transistor having base, collector and emitter electrodes, a first resistor, said first resistor being connected between one of said input terminals and one of said sources of D.C. potential via one of said fuses, said collector and emitter electrodes being connected between the other of said input terminals and the other of said sources of D.C. potential via the other of said fuses, second and third transistors connected in differential amplifier configuration and each having base, collector and emitter electrodes, means connecting said emitter electrodes of said second and third transistors to one of said sources of D.C. potential via one of said fuses to bias on said second and third transistors, means connecting said collector electrode of said second transistor and said base electrode of said predriver transistor whereby said predriver transistor is biased on from said sources of D.C. potential when said fuses are intact, means for applying an input signal to said base electrode of said second transistor, a negative D.C. feedback network connected between said output terminal and said base electrode of said third transistor and a diode connected directly to ground in series circuit with said emitter electrode of said predriver transistor, said diode being poled and connected to permit said predriver transistor to be biased on when said other fuse blows.

2. A current amplifier according to claim 1 including a Zener diode connected in a circuit including the one of said sources of D.C. potential to which said emitter electrodes of said second and third transistors are connected and the one of said fuses via which the immediately aforementioned connection is made.

3. A current amplifier according to claim 1 including a second resistor connected between said base and emitter electrodes of said predriver transistor, said second resistor also being connected in circuit between said collector electrode of said second transistor and said other source of D.C. potential via said other fuse.

4. A current amplifier according to claim 1 wherein said diode is connected between said emitter electrode of said predriver transistor and a terminal at a D.C. potential between said D.C. potentials of said sources of D.C. potential.

* * * * *